(12) United States Patent
Yuan et al.

(10) Patent No.: US 6,713,850 B1
(45) Date of Patent: Mar. 30, 2004

(54) TAPE CARRIER PACKAGE STRUCTURE WITH DUMMY PADS AND DUMMY LEADS FOR PACKAGE REINFORCEMENT

(75) Inventors: Po-Hao Yuan, Taichung (TW); Chi-Chuan Wu, Taichung (TW); Chih-Shun Chen, Kaohsiung (TW)

(73) Assignee: Siliconware Precision Industries Co., ltd. (TW)

( * ) Notice: Subject to any disclaimer, the term of this patent is extended or adjusted under 35 U.S.C. 154(b) by 0 days.

(21) Appl. No.: 09/718,669

(22) Filed: Nov. 22, 2000

(51) Int. Cl.⁷ .................. H01L 23/495; H01L 21/50
(52) U.S. Cl. .................. 257/668; 257/667; 257/787; 257/670; 257/669; 257/674; 257/671; 438/123; 438/124; 438/613
(58) Field of Search .................. 257/667, 787, 257/670, 663, 674, 668, 671, 669; 438/123, 124, 613, 125

(56) References Cited

U.S. PATENT DOCUMENTS 6,060,770 A * 5/2000 Nakamura et al.
6,265,762 B1 * 7/2001 Tanaka et al.
6,268,644 B1 * 7/2001 Umehara et al. ............ 257/667

* cited by examiner

Primary Examiner—Wael Fahmy
Assistant Examiner—DiLinh Nguyen
(74) Attorney, Agent, or Firm—Peter F. Corless; Steven M. Jensen; Edwards & Angell, LLP

(57) ABSTRACT

An improved tape carrier package (TCP) structure is proposed, which is characterized in the provision of dummy pads and dummy leads to help reinforce the package construction. The dummy pads are provided on the corners of the semiconductor chip, while the dummy leads are bonded between the dummy pads and corner-situated lead-bonding areas on the tape carrier. During assembly, since dummy leads are bonded between the dummy pads and corner-situated lead-bonding areas, the corners of the semiconductor chip can be firmly supported as well as the four sides of the semiconductor chip which are supported by the I/O leads. As a result the package construction is reinforced. During inner-lead bonding (ILB) process, such reinforcement can help prevent the cracking of the I/O leads. Moreover, during encapsulation process, the provision of the dummy leads can help allow the encapsulation material to be more evenly distributed to the back side of the semiconductor chip, thus preventing undesired forming of voids in the resulted encapsulation body, making the resulted encapsulation body less likely subjected to popcorn effect and delamination. In addition, it can help provide a uniform package height (UPH) to the overall package construction. These advantages allow the finished TCP product to be more assured in quality and reliability.

12 Claims, 3 Drawing Sheets

TAPE CARRIER PACKAGE STRUCTURE WITH DUMMY PADS AND DUMMY LEADS FOR PACKAGE REINFORCEMENT

BACKGROUND OF THE INVENTION

1. Field of the Invention

This invention relates to integrated circuit packaging technology, and more particularly, to a tape carrier package (TCP) structure with dummy pads and dummy leads for reinforcement of the package construction.

2. Description of Related Art

TCP (Tape Carrier Package) is an advanced type of integrated circuit packaging technology which is characterized in the use of a tape carrier, rather than a leadframe or a substrate, as the chip-mounting base, and also in the use of TAB (Tape Automated Bonding) technology to implement the overall packaging process. The tape carrier is typically formed with a device hole for accommodating the packaged semiconductor chip, and a plurality of inner leads bonded to the I/O pads of the packaged semiconductor chip to serve as external connecting means for the packaged semiconductor chip. A conventional TCP structure is illustratively depicted in the following with reference to FIGS. 1A–1D.

Referring to FIG. 1A, the conventional TCP structure is used to pack a semicon-ductor chip 110 having a plurality of I/O pads 111 arranged along the four sides thereof (note that FIGS. 1A–1C are simplified to show only a small number of bond pads and those parts that are related to the invention for demonstration purpose, the actual circuit layout of the TCP structure may be much more complex).

By the conventional TCP technology, however, no I/O pads are arranged on the four corners 110a, 110b, 110c, 110d of the semiconductor chip 110 (the four corners 110a, 110b, 110c, 110d are indicated by the dotted circles in FIG. 1A).

Referring further to FIG. 1B, the semiconductor chip 110 of FIG. 1A is to be mounted on a tape carrier 120, such as a TAB tape, which is formed with a centrally-located device hole 120a and is predefined with a plurality of lead-bonding areas 121 surrounding the device hole 120a the areas indicated by the dotted rectangular boxes in FIG. 1B)

Referring further to FIG. 1C, during assembly, the fist step is to mount the semicon-ductor chip 110 of FIG. 1A in the device hole 120a of the tape carrier 120 of FIG. 1B. As the semiconductor chip 110 is mounted in position, an ILB (Inner Lead Bonding) process is performed to bond a set of electrically-conductive inner leads 130 between the respective I/O pads 111 on the semiconductor chip 110 and the lead-bonding areas 121 on the tape carrier 120 to serve as external connecting means for the packaged semiconductor chip 110.

Referring further to FIG. 1C, in the next step, an encapsulation process is performed to dispense an encapsulation material, such as resin, through the gaps between the inner leads 130 into the device hole 120a so as to form an encapsulation body 140 to encapsulate the semiconductor chip 110.

In practical realization, however, the foregoing conventional TCP technology has the following drawbacks.

First, since the four corners 110a, 110b, 110c, 110d of the semiconductor chip 110 are provided with no bond pads and unconnected to any leads, these four corners 110a, 110b, 110c, 110d of the semiconductor chip 110 would be nearly unsupported. As a result, during the ILB process, it would easily cause cracking of the inner leads 130. In addition, during the movement of the tape carrier 120, it would easily cause the package construction to be subjected to deformation.

Second, during the potting process, since the comer-situated lead gap width (denoted by W in FIG. 1B) is considerably greater than the pitch of the side-situated inner leads 130 (denoted by P in FIG. 1B), it would cause the potting of the encapsulation material through these inner leads 130 during the encapsulation process to be unevenly distributed to the back side of the semiconductor chip 110, which would easily cause undesired forming of voids that would be easily subjected to popcorn effect and delamination, thus degrading the quality and reliability of the finished TCP product.

SUMMARY OF THE INVENTION

It is therefore an objective of this invention to provide an improved TCP technology which allows the corners of the packaged semiconductor chip to be firmly supported.

It is another objective of this invention to provide an improved TCP technology which allows the encapsulation material to be substantially evenly distributed to the back side of the packaged semiconductor chip, so as to allow the resulted encapsulation body to be substantially free of voids for prevention of undesired popcorn effect and delamination.

It is still another objective of this invention to provide an improved TCP technology which would prevent the package construction from being deformed during movement of the tape carrier.

In accordance with the foregoing and other objectives, the invention proposes an improved TCP structure.

Broadly recited, the TCP structure of the invention comprises the following constituent components: (a) a semiconductor chip having: (a1) a plurality of I/O pads arranged along the sides thereof; and (a2) a plurality of dummy pads arranged on the corners thereof; (b) a tape carrier having a device hole and a plurality of side-situated lead-bonding areas and comer-situated lead-bonding areas surrounding the device hole, (c) a set of inner leads, including: (c1) a group of I/O leads, which are bonded between the respective I/O pads on the semiconductor chip and the side-situated lead-bonding areas on the tape carrier; and (c2) group of dummy leads, which are bonded between the respective dummy pads on the semiconductor chip and the comer-situated lead-bonding areas on the tape carrier.

During assembly, since dummy leads are bonded between the dummy pads and the corner-situated lead-bonding areas, the corners of the semiconductor chip can be firmly supported in addition to the lateral support of the semiconductor chip by the functional I/O leads, thus reinforcing the package construction During the inner-lead bonding (ILB) process, such reinforcement can help prevent the cracking of any of the I/O leads. More-over, during encapsulation process, since the provision of the dummy leads can help reduce the lead gap width at the four corners of the device hole, it can help the encapsulation material to be more evenly distributed to the back side of the semiconductor chip, thus preventing the undesired forming of voids in the resulted encapsulation body making the resulted encapsulation body less likely to be subjected to popcorn effect and delamination. In addition, it can help provide a uniform package height (UPH) to the overall package construction. These advantages allow the finished TCP product to be more assured in quality and reliability than prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the improved TCP structure according to the invention is disclosed in full details in the following with reference to FIGS. 2A–2B.

Figure 1A:
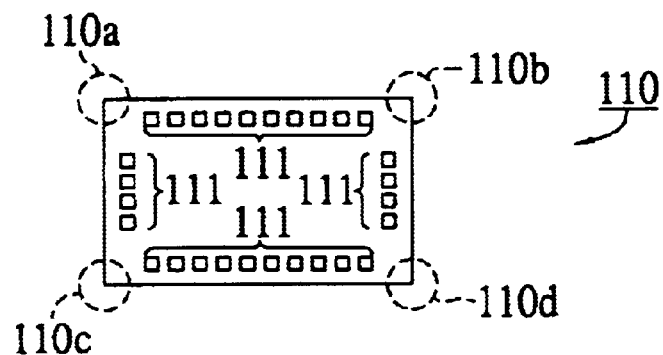
FIG. 1A (PRIOR ART) shows a schematic top view of a conventional semiconductor chip.
Figure 1B:
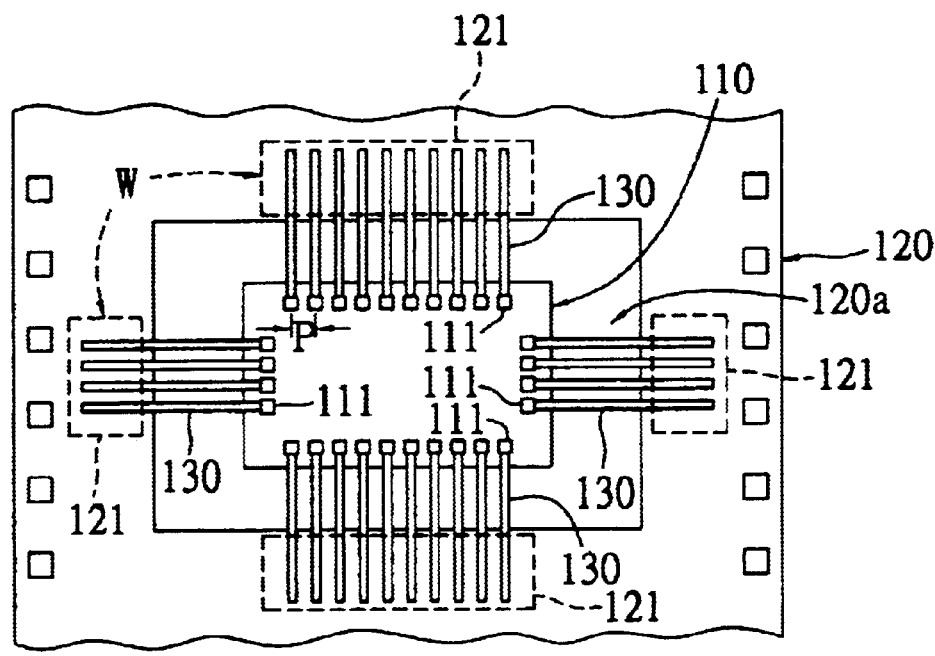
FIG. 1B (PRIOR ART) shows a schematic top view of an individual TCP unit for packaging the semiconductor chip of FIG. 1A.
Figure 1C:
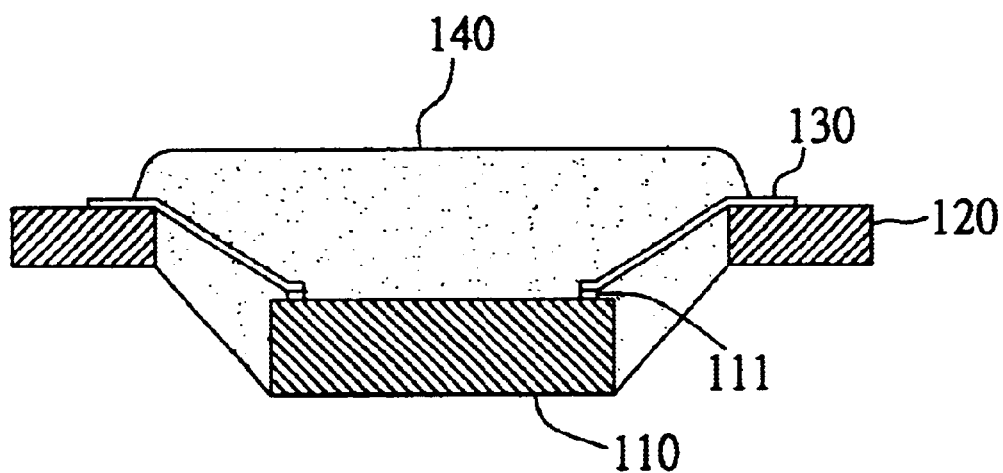
FIG. 1C (PRIOR ART) shows a schematic cross-sectional view of the TCP construction of FIG. 1C after being encapsulated.
Figure 2A:
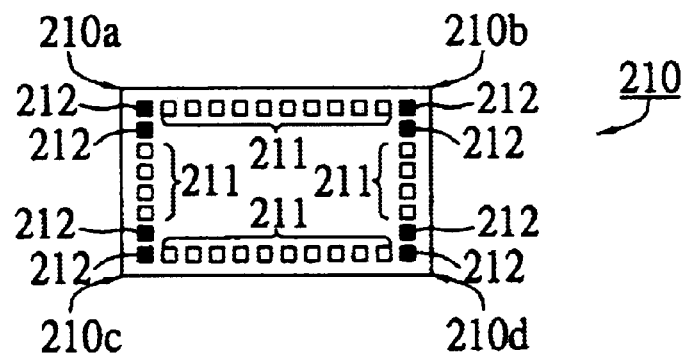
FIG. 2A shows a schematic top view of a semiconductor chip with dummy pads according to the invention.

Referring to FIG. 2A, the improved TCP structure according to the invention is used to pack a semiconductor chip 210 having a plurality of functional I/O pads 211 arranged along the four sides thereof. It is an important aspect of the invention that the semiconductor chip 210 is further formed with a plurality of non-functional dummy pads 212 on the four corners 210a, 210b, 210c, 210d thereof (note that FIGS. 2A–2B are simplified to show only a small number of I/O pads and dummy pads and those parts that are related to the invention; the actual circuit layout of the TCP structure may be much more complex).

In this embodiment, for example, the semiconductor chip 210 is an LCD (Liquid Crystal Display) driver chip; and the I/O pads 211 and the dummy pads 212 are made of aluminum. However, broadly recited, the semiconductor chip 210 can be any of various other types of semiconductor chips, while the I/O pads 211 and the dummy pads 212 can be made of any of various other suitable electrically-conductive materials.

Figure 2B:
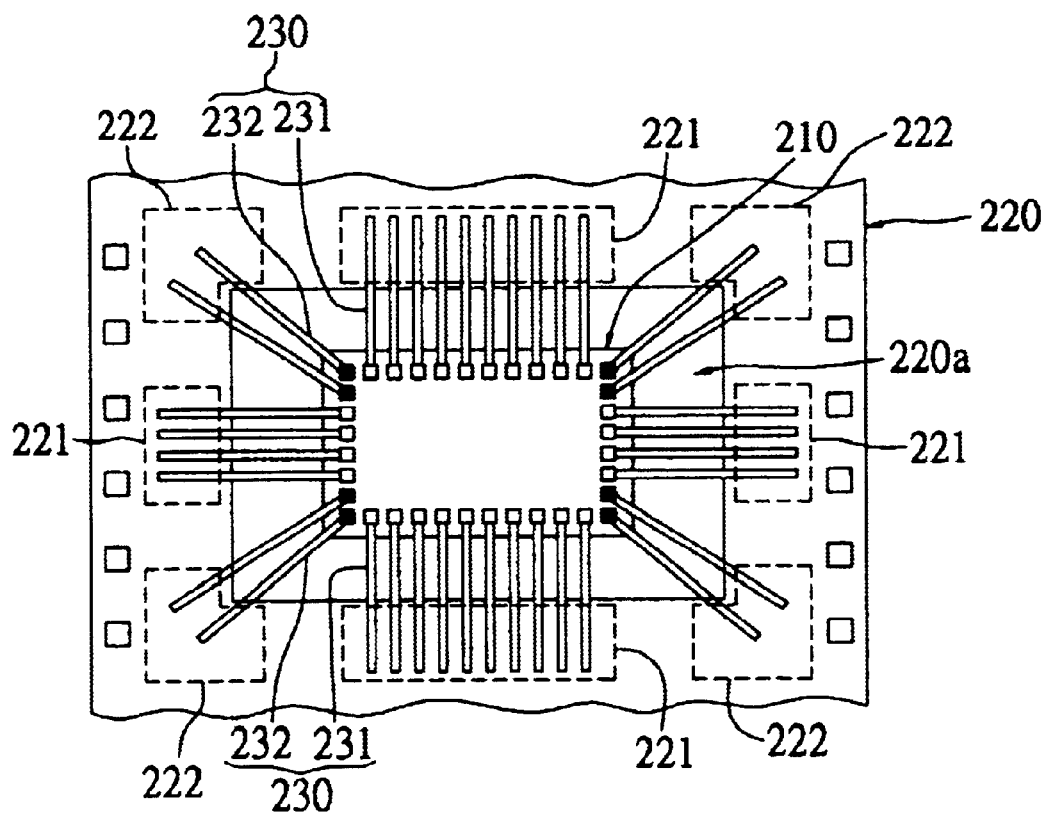
FIG. 2B shows a schematic top view of an individual TCP unit for packaging the semiconductor chip of FIG. 2A according to the invention.

Referring further to FIG. 2B, the TCP structure of the invention is constructed on a tape carrier 220 having a centrally-located device hole 220a and predefiend with a plurality of side-situated lead-bonding areas 221 along the four sides of the device hole 220a and a plurality of comer-situated lead-bonding areas 222 on the corners of the device hole 220a. The side-situated lead-bonding areas 221 are pre-bonded with a first group of inner leads 231 serving as I/O leads, while the corner-situated lead-bonding areas 222 are pre-bonded with a second group of inner leads 232 serving as dummy leads.

During assembly, the semiconductor chip 210 of FIG. 2A is mounted in the device hole 220a of the tape carrier 220 of FIG. 2B. As the semiconductor chip 210 is mounted in position, an ILB (Inner Lead Bonding) process is performed to bond the I/O leads 231 to the functional I/O pads 211 on the semiconductor 210 and meanwhile bond the dummy leads 232 to the non-functional dummy pads 212.

Preferably, the dummy leads 232 are spaced at the same pitch as the I/O leads 231, so that the pitch of the total set of the I/O leads 231 and the dummy leads 232 can be substantially equally spaced. This lead arrangement scheme can help facilitate the subsequent potting of encapsulation material through these 110 leads 231 and dummy leads 232 to be evenly distributed to the back side of the semiconductor chip 210, thereby preventing the undesired forming of voids in the resulted encapsulation body (not shown), so that the resulted encapsulation body (not shown) would be less likely subjected to popcorn effect and delamination.

The bonding of the dummy leads 232 between the dummy pads 212 and the corner-situated lead-bonding areas 222 can help provide a firm support to the four corners 210a, 210b, 210c, 210d of the semiconductor chip 210 in addition to the lateral support of the semiconductor chip 210 by the 110 leads 231, thereby reinforcing the mounting of the semiconductor chip 210 on the tape carrier 220. During the ILB process, such reinforcement can help prevent the cracking of any of the I/O leads 231.

Subsequently, an encapsulation process is performed by potting an encapsulation material, such as resin, through the gaps between the I/O leads 231 and the dummy leads 232 into the device hole 220a so as to form an encapsulation body (not shown) to encapsulate the semiconductor chip 210.

During the encapsulation process, since the provision of the dummy leads 232 can help reduce the lead gap width at the four corners of the device hole 220a, it can help the encapsulation material to be more evenly distributed to the back side of the semiconductor chip 210, thus preventing the undesired forming of voids in the resulted encapsulation body (not shown), making the resulted encapsulation body (not shown) less likely to be subjected to popcorn effect and delamination. Moreover, it can help provide a uniform package height (UPH) to the overall package construction.

During the movement of the tape carrier tape carrier 220, the total set of the I/O leads 231 and the dummy leads 232 can provide a firm support to the entirety of the semiconductor chip 210, so that it can help prevent the package construction from subjecting to warpage due to the stress from the movement.

In conclusion, the invention provides an improved TCP technology which is characterized in the provision of dummy pads and dummy leads to help reinforce the structural strength of the package construction. During assembly, since dummy leads are bonded between the dummy pads and the corner-situated lead-bonding areas, the corners of the semiconductor chip can be firmly supported in addition to the lateral support of the semi-conductor chip by the functional I/O leads, thereby reinforcing the package construction. During the inner-lead bonding (ILB) process, such reinforcement can help prevent the cracking of any of the I/O leads. Moreover, during encapsulation process, since the provision of the dummy leads can help reduce the lead gap width at the four corners of the device hole, it can help the encapsulation material to be more evenly distributed to the back side of the semiconductor chip, thus preventing the undesired forming of voids in the resulted encapsulation body, making the resulted encapsulation body less likely to be subjected to popcorn effect and delamination. In addition, it can help provide a uniform package height (UPH) to the overall package construction. These advantages allow the finished TCP product to be more assured in quality and reliability than prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A tape carrier package structure, which comprises:
   (a) a semiconductor chip having:
      (a1) a plurality of I/O pads arranged along sides thereof; and
      (a2) a plurality of dummy pads arranged on the sides thereof at positions free of the I/O pads and spaced at the same pitch as the I/O pads, making the sides of the semiconductor chip full of the plurality of equally spaced I/O pads and dummy pads;
   (b) a tape carrier having a device hole for accommodating the semiconductor chip therein and a plurality of side-situated lead-bonding areas and corner-situated lead-bonding areas surrounding the device hole;
   (c) a set of inner leads, including:
      (c1) a group of I/O leads, which are bonded between the respective I/O pads on the semiconductor chip and the side-situated lead-bonding areas on the tape carrier, so as to allow the semiconductor chip to be electrically connected to the tape carrier by the I/O leads; and
      (c2) a group of dummy leads, which are bonded between the respective dummy pads on the semiconductor chip and the corner-situated lead-bonding areas on the tape carrier, and thereby provide firm support to the corners of the semiconductor chip, so as to hold the semiconductor chip in position with respect to the tape carrier and to enhance mechanical strength of the tape carrier package structure.

2. The tape carrier package structure of claim 1, wherein the tape carrier is a TAB tape.

3. The tape carrier package structure of claim 1, wherein the semiconductor chip is an LCD driver chip.

4. The tape carrier package structure of claim 1, wherein the I/O pads and the dummy pads on the semiconductor chip are made of aluminum.

5. The tape carrier package structure of claim 1, wherein the dummy leads are spaced at substantially the same pitch as the I/O leads.

6. A tape carrier package structure, which comprises:
   (a) a semiconductor chip having:
      (a1) a plurality of I/O pads arranged along sides thereof; and
      (a2) a plurality of dummy pads arranged on the sides thereof at positions free of the I/O pads and spaced at the same pitch as the I/O pads, making the sides of the semiconductor chip full of the plurality of equally spaced I/O pads and dummy pads;
   (b) a tape carrier having a device hole for accommodating the semiconductor chip therein and a plurality of side-situated lead-bonding areas and corner-situated lead-bonding areas surrounding the device hole;
   (c) a set of inner leads, including:
      (c1) a group of I/O leads, which are bonded between the respective I/O pads on the semiconductor chip and the side-situated lead-bonding areas on the tape carrier, so as to allow the semiconductor chip to be electrically connected to the tape carrier by the I/O leads; and
      (c2) a group of dummy leads, which are bonded between the respective dummy pads on the semiconductor chip and the corner-situated lead-bonding areas on the tape carrier, and thereby provide firm support to the corners of the semiconductor chip, so as to hold the semiconductor chip in position with respect to the tape carrier and to enhance mechanical strength of the tape carrier package structure, and which are spaced at substantially the same pitch as the I/O leads.

7. The tape carrier package structure of claim 6, wherein the tape carrier is a TAB tape.

8. The tape carrier package structure of claim 6, wherein the semiconductor chip is an LCD driver chip.

9. The tape carrier package structure of claim 6, wherein the I/O pads and the dummy pads on the semiconductor chip are made of aluminum.

10. A tape carrier package structure, which comprises:
    (a) a semiconductor chip having:
       (a1) a plurality of I/O pads arranged along sides thereof; and
       (a2) a plurality of dummy pads arranged on the sides thereof at positions free of the I/O pads and spaced at the same pitch as the I/O pads, making the sides of the semiconductor chip full of the plurality of equally spaced I/O pads and dummy pads;
    (b) a TAB tape having a device hole for accommodating the semiconductor chip therein and a plurality of side-situated lead-bonding areas and corner-situated lead-bonding areas surrounding the device hole;
    (c) a set of inner leads, including:
       (c1) a group of I/O leads, which are bonded between the respective I/O pads on the semiconductor chip and the side-situated lead-bonding areas on the TAB tape, so as to allow the semiconductor chip to be electrically connected to the TAB tape by the I/O leads; and
       (c2) a group of dummy leads, which are bonded between the respective dummy pads on the semiconductor chip and the corner-situated lead-bonding areas on the TAB tape, and thereby provide firm support to the corners of the semiconductor chip so as to hold the semiconductor chip in position with respect to the tape carrier and to enhance mechanical strength of the tape carrier package structure, and which are spaced at substantially the same pitch as the I/O leads.

11. The tape carrier package structure of claim 10, wherein the semiconductor chip is an LCD driver chip.

12. The tape carrier package structure of claim 10, wherein the I/O pads and the dummy pads on the semiconductor chip are made of aluminum.

* * * * *